(12) United States Patent
Okita

(10) Patent No.: US 11,305,319 B2
(45) Date of Patent: Apr. 19, 2022

(54) DEVICE AND METHOD FOR CLEANING MONOCRYSTALLINE PULLING APPARATUS

(71) Applicant: SUMCO CORPORATION, Tokyo (JP)

(72) Inventor: Kenji Okita, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 362 days.

(21) Appl. No.: 16/482,016

(22) PCT Filed: Feb. 2, 2018

(86) PCT No.: PCT/JP2018/003666
§ 371 (c)(1),
(2) Date: Jul. 30, 2019

(87) PCT Pub. No.: WO2018/143434
PCT Pub. Date: Aug. 9, 2018

(65) Prior Publication Data
US 2020/0001335 A1 Jan. 2, 2020

(30) Foreign Application Priority Data
Feb. 2, 2018 (WO) .................. PCT/JP2018/003666

(51) Int. Cl.
*B08B 9/04* (2006.01)
*B08B 9/043* (2006.01)
(Continued)

(52) U.S. Cl.
CPC ............ *B08B 9/0436* (2013.01); *B08B 1/006* (2013.01); *B08B 1/008* (2013.01); *B08B 5/00* (2013.01); *B08B 9/087* (2013.01); *C30B 35/00* (2013.01)

(58) Field of Classification Search
None
See application file for complete search history.

(56) References Cited

U.S. PATENT DOCUMENTS
2004/0089323 A1* 5/2004 Hatley .................... B08B 9/043
134/8

FOREIGN PATENT DOCUMENTS
CN 201530876 U 7/2010
CN 105358743 A 2/2016
(Continued)

OTHER PUBLICATIONS

Machine Translation of JP2001-348293 by Kenji Hori, published Dec. 18, 2001.*

(Continued)

*Primary Examiner* — Mikhail Kornakov
*Assistant Examiner* — Ryan L Coleman
(74) *Attorney, Agent, or Firm* — Greenblum & Bernstein, P.L.C.

(57) ABSTRACT

A device for cleaning the inside of a monocrystalline pulling apparatus includes a main tube unit to be inserted into a pull chamber and an inner surface cleaning mechanism that is provided at an upper part of the main tube unit and cleans the inner surface of the pull chamber. The main tube unit includes a retreat/housing section into which a seed chuck provided at the lower end of a wire retreats and which houses the seed chuck therein, and a continuous extension mechanism that is provided at the lower part of the main tube unit and to which a plurality of extension rods are capable of being added and joined. Accordingly, the inner surface of the pull chamber is efficiently cleaned.

7 Claims, 7 Drawing Sheets (51) Int. Cl.
    *B08B 1/00*         (2006.01)
    *B08B 5/00*         (2006.01)
    *B08B 9/087*       (2006.01)
    *C30B 35/00*       (2006.01)

(56) References Cited

FOREIGN PATENT DOCUMENTS

| JP | 10-45488 | 2/1998 |
| JP | 2001-348293 | 12/2001 |
| JP | 2015-006642 | 1/2015 |
| KR | 10-2017-0099950 A | 9/2017 |
| WO | WO 2016/125605 A1 | 8/2016 |

OTHER PUBLICATIONS

Machine Translation of JP2015-006642 by Yuki Nakajima, published Jan. 15, 2015.*
Office Action for CN App. No. 201880009567.1, dated Nov. 12, 2020 (w/ partial translation).
International Search Report for International Patent Application No. PCT/JP2018/003666, dated Apr. 3, 2018; and English-language translations thereof.
International Preliminary Report on Patentability for International Patent Application No. PCT/JP2018/003666, dated Aug. 6, 2019.
Office Action for KR App. No. 10-2019-7022919, dated Sep. 2, 2021 (w/ translation).

* cited by examiner

DEVICE AND METHOD FOR CLEANING MONOCRYSTALLINE PULLING APPARATUS

TECHNICAL FIELD

The present invention relates to a device and method of cleaning a monocrystalline pulling apparatus, and more particularly, to a technique that is suitably used to clean the inside of a monocrystalline pulling apparatus for pulling a semiconductor monocrystal, such as a silicon monocrystal, from semiconductor melt stored in a crucible by a wire using Czochralski method (CZ method).

BACKGROUND ART

Generally, a monocrystalline pulling apparatus using CZ method is known as one of means for growing a semiconductor monocrystal, such as silicon (Si) or gallium arsenide (GaAs). To perform pull and growth in the monocrystalline pulling apparatus, first, semiconductor melt is stored in a quartz crucible disposed in a chamber, which is a sealed vessel, and the heating of the semiconductor melt up to a predetermined temperature is controlled by a heater disposed around the quartz crucible.

Then, a semiconductor monocrystal is pulled from the semiconductor melt, which is stored in the quartz crucible disposed below a pull chamber provided at the upper portion of the chamber, by a wire (tungsten or the like) that is suspended in the pull chamber.

Such a monocrystalline pulling apparatus includes a winding device (not shown) for the wire pulling a semiconductor monocrystal. The winding device is provided in a pull head that is rotatably provided on the pull chamber. That is, the wire is suspended into the pull chamber from the pull head through a centerpiece portion that is a hole allowing the pull head and the pull chamber to communicate with each other.

There is a concern that adhering matter, such as vapor of Si, may be generated on the inner surface or the like of the pull chamber during pull and growth and the adhering matter may fall as powder dust in the monocrystalline pulling apparatus. Since the powder dust affects pull and growth and causes the dislocation of a monocrystal, there is a concern that the powder dust may cause a crystal-pulling property to deteriorate. For this reason, the pull chamber and the wire are cleaned (PTL 1).

Since the pull chamber and the wire are positioned at the upper portion of the monocrystalline pulling apparatus, the pull chamber and the wire are positioned at a high position. Accordingly, for the cleaning of the pull chamber and the wire, in a technique disclosed in PTL 1, the inner surface of the pull chamber and the wire are simultaneously cleaned by a large-scale device which includes pedestal lifting means, a pedestal, a rotary table, nozzle lifting means, air jet nozzles, and the like and is sealed after a chamber shell is placed thereon.

CITATION LIST

Patent Literature

[PTL 1] Japanese Unexamined Patent Application. First Publication No. H10-045488

DISCLOSURE OF INVENTION

Technical Problem

Particularly, since the diameter of a quartz crucible has been increased in recent years, the amount of adhering matter, such as Si vapor, to be generated has also been increased. Accordingly, the necessary frequency of cleaning is much more being increased to prevent dislocation.

However, there are many factors that need to be adjusted for the next pull, such as a wire and a seed chuck, in a case where the wire and the inner surface of the pull chamber are to be simultaneously cleaned as in PTL 1. For this reason, since work required for cleaning is increased, there is a problem that work efficiency is lowered. Further, since the large-scale device needs to be moved in the technique disclosed in PTL 1, there is a problem that long work time is required. For this reason, there is a demand that only the inner surface of the pull chamber on which the amount of adhering matter to be generated is large is to be more simply and efficiently cleaned in a short time.

The invention has been made in consideration of the above-mentioned circumstances, and an object of the invention is to provide a device and method of cleaning a monocrystalline pulling apparatus that allow the cleaning of the inner surface of a pull chamber, which is to be more frequently performed than the cleaning of a wire, to be easily and efficiently performed in a short time.

Solution to Problem

It is proved from the inventors' earnest study that it is preferable to perform the cleaning of the inner surface of the pull chamber whenever the pull and growth of a monocrystal end, to prevent or reduce dislocation. Particularly, it is proved that more frequently performing the cleaning of the pull chamber than the cleaning of the wire is effective to prevent or reduce dislocation.

The object is achieved by a device for cleaning a monocrystalline pulling apparatus in which an inside of the monocrystalline pulling apparatus of the invention that pulls a semiconductor monocrystal from semiconductor melt stored in a crucible installed below a pull chamber by a wire suspended in the pull chamber of a sealed vessel is cleaned. The device includes a main tube unit that is inserted into the pull chamber, and an inner surface cleaning mechanism that is provided at an upper part of the main tube unit and cleans an inner surface of the pull chamber. The main tube unit includes a retreat/housing section into which a seed chuck provided at a lower end of a wire retreats and which houses the seed chuck therein, and a continuous extension mechanism that is provided at a lower part of the main tube unit and to which a plurality of extension rods are added and joined in an axial direction.

The inner surface cleaning mechanism of the invention may include a wiper member that is provided on an outer peripheral surface of the main tube unit and is in contact with the inner surface of the pull chamber in a state where the main tube unit is inserted into the pull chamber.

The wiper member of the invention may be provided in an annular shape along an inner peripheral surface of the pull chamber.

The inner surface cleaning mechanism of the invention may include a wiper activating mechanism that deforms or moves the wiper member in a radial direction of the main tube unit.

The wiper activating mechanism of the invention may include a flexible bag body that is provided between the wiper member and the outer peripheral surface of the main tube unit, and the flexible bag body is inflated by the injection of air.

The flexible bag body of the invention may be a rubber tube that is provided in an annular shape along the outer peripheral surface of the main tube unit.

The device of the invention may further include an axial position regulating mechanism that is provided at the lower part of the main tube unit and regulates an axial position of the main tube unit with respect to a direction of a central axis of the pull chamber in a state where the main tube unit is inserted into the pull chamber.

The axial position regulating mechanism of the invention may include a guide member that is provided on an outer peripheral surface of the main tube unit and is in contact with the inner surface of the pull chamber in a state where the main tube unit is inserted into the pull chamber.

The guide member of the invention may have a diameter substantially equal to or smaller than a diameter of the wiper member and may be provided in a substantially annular shape along an inner peripheral surface of the pull chamber.

The inner surface cleaning mechanism of the invention may include a second wiper member that is provided on an outer peripheral surface of a lower part of the main tube unit and is in contact with the inner surface of the pull chamber in a state where the main tube unit is inserted into the pull chamber.

The object is achieved by a method of cleaning a monocrystalline pulling apparatus in which a wire of the monocrystalline pulling apparatus that pulls a semiconductor monocrystal from semiconductor melt stored in a crucible installed below a pull chamber by a wire suspended in the pull chamber of a sealed vessel is cleaned. The method includes: inserting a main tube unit of a cleaning device into the pull chamber; and adding and joining a plurality of extension rods, which are a continuous extension mechanism, to a lower part of the main tube unit. In a state where a seed chuck retreats into and is housed in a retreat/housing section provided below the wire in the main tube unit, a wiper member of an inner surface cleaning mechanism provided on an outer peripheral surface of an upper part of the main tube unit slides on an inner surface of the pull chamber while being in contact with the inner surface of the pull chamber and cleans the inner surface of the pull chamber.

In a case where the main tube unit is to be inserted into the pull chamber, an axial position of the main tube unit may be regulated with respect to a direction of a central axis of the pull chamber by a guide member of an axial position regulating mechanism provided at a lower part of the main tube unit of the invention.

A device for cleaning a monocrystalline pulling apparatus in which an inside of the monocrystalline pulling apparatus of the invention, which pulls a semiconductor monocrystal from semiconductor melt stored in a crucible installed below a pull chamber by a wire suspended in the pull chamber of a sealed vessel is cleaned, includes a main tube unit that is inserted into the pull chamber, and an inner surface cleaning mechanism that is provided at an upper part of the main tube unit and cleans an inner surface of the pull chamber. The main tube unit includes a retreat/housing section into which a seed chuck provided at a lower end of a wire retreats and which houses the seed chuck therein, and a continuous extension mechanism that is provided at a lower part of the main tube unit and to which a plurality of extension rods are added and joined in an axial direction. Accordingly, the main tube unit is inserted into the pull chamber, the upper part of the main tube unit where the inner surface cleaning mechanism is disposed is made to reach the vicinity of the top portion of the pull chamber by the continuous extension mechanism, the seed chuck is housed in the retreat/housing section formed in the main tube unit to be in a retreat state, and the cleaning of the inner surface of the pull chamber can be performed at a position in the pull chamber. Therefore, it is possible to quickly and easily clean the inner surface of the pull chamber, which has been subjected to the pull of a semiconductor monocrystal, from the lower side of the pull chamber without using a large-scale device such as a carriage.

The inner surface cleaning mechanism of the invention includes a wiper member that is provided on an outer peripheral surface of the main tube unit and is in contact with the inner surface of the pull chamber in a state where the main tube unit is inserted into the pull chamber. Accordingly, since the wiper member is in contact with the inner surface of the pull chamber, the wiper member can slide on the inner surface of the pull chamber and scrape adhering matter off in a case where the main tube unit is moved up and down in a state where the main tube unit is inserted.

The wiper member of the invention is provided in an annular shape along an inner peripheral surface of the pull chamber. Accordingly, the wiper member can be in contact with the inner surface of the pull chamber in the circumferential direction and easily clean the entire inner peripheral surface of the pull chamber.

The inner surface cleaning mechanism of the invention includes a wiper activating mechanism that deforms or moves the wiper member in a radial direction of the main tube unit. Accordingly, the wiper member can be in contact with and be spaced apart from the inner peripheral surface of the pull chamber freely. Therefore, since it is possible to separate the wiper member from the inner peripheral surface of the pull chamber in cases other than a case where cleaning is to be actually performed, it is possible to smoothly insert the main tube unit into the pull chamber or to smoothly take the main tube unit out of the pull chamber without the obstruction of the wiper member in a case where the main tube unit is to be inserted into and set in the pull chamber or is to be taken out of the pull chamber. Further, it is possible to prevent the inner surface of the pull chamber from being damaged by the main tube unit.

The wiper activating mechanism of the invention includes a flexible bag body that is provided between the wiper member and the outer peripheral surface of the main tube unit, and the flexible bag body is inflated by the injection of air. Accordingly, the wiper member provided outside the flexible bag body can be moved or deformed outward in the radial direction, so that the wiper member can be in contact with the inner peripheral surface of the pull chamber. Therefore, the wiper member can be easily deformed or moved by only simple means, such as the inflation of the flexible bag body.

The flexible bag body of the invention is a rubber tube that is provided in an annular shape along the outer peripheral surface of the main tube unit. Accordingly, since the rubber tube can be easily and quickly inflated over the entire outer periphery of the main tube unit, the wiper member can be deformed or moved over the entire outer periphery of the main tube unit, can quickly and simultaneously slide over the entire outer periphery of the main tube unit, and can clean the entire outer periphery of the main tube unit.

The device of the invention further includes an axial position regulating mechanism that is provided at the lower part of the main tube unit and regulates an axial position of the main tube unit with respect to a direction of a central axis of the pull chamber in a state where the main tube unit is inserted into the pull chamber. Accordingly, when the main tube unit is inserted into the pull chamber and the main tube unit is to be raised by the continuous extension mechanism until the inner surface cleaning mechanism reaches the vicinity of the top portion of the pull chamber, it is possible to prevent a damage to the inner surface of the pull chamber caused by the main tube unit and the generation of dust caused by the contact between the lower part of the main tube unit and the inner surface of the pull chamber that may occur in a case where the axial direction of the main tube unit is inclined and the lower part of the main tube unit is in contact with the inner surface of the pull chamber. Further, when the seed chuck is made to retreat to be housed in the retreat/housing section formed in the main tube unit, it is possible to prevent a damage to the seed chuck caused by the main tube unit and the generation of dust caused by the contact between the inner surface of the retreat/housing section and the seed chuck that may occur in a case where the axial direction of the main tube unit is inclined and the inner surface of the retreat/housing section is in contact with the seed chuck.

The axial position regulating mechanism of the invention includes a guide member that is provided on an outer peripheral surface of the main tube unit and is in contact with the inner surface of the pull chamber in a state where the main tube unit is inserted into the pull chamber. Accordingly, it is possible to prevent a damage to the inner surface of the pull chamber caused by the main tube unit and the generation of dust caused by the contact between the main tube unit and the inner surface of the pull chamber that may occur in a case where the main tube unit other than the wiper member and the guide member is in contact with the inner surface of the pull chamber.

The guide member of the invention has a diameter substantially equal to or smaller than a diameter of the wiper member and is provided in a substantially annular shape along an inner peripheral surface of the pull chamber. Accordingly, it is possible to raise the main tube unit while maintaining a state where the axial direction of the main tube unit substantially coincides with the axial direction of the pull chamber.

The inner surface cleaning mechanism of the invention includes a second wiper member that is provided on an outer peripheral surface of a lower part of the main tube unit and is in contact with the inner surface of the pull chamber in a state where the main tube unit is inserted into the pull chamber. Accordingly, it is possible to raise the main tube unit while maintaining a state where the axial direction of the main tube unit substantially coincides with the axial direction of the pull chamber as in the case of the guide member. Further, since two positions (two circumferential positions) of the wiper member and the second wiper member can simultaneously slide over the entire outer periphery of the main tube unit, the removal of matter and the like adhering to the inner surface of the pull chamber can be further suppressed.

A method of cleaning a monocrystalline pulling apparatus in which a wire of the monocrystalline pulling apparatus of the invention, which pulls a semiconductor monocrystal from semiconductor melt stored in a crucible installed below a pull chamber by a wire suspended in the pull chamber of a sealed vessel is cleaned, includes: inserting a main tube unit of a cleaning device into the pull chamber; and adding and joining a plurality of extension rods, which are a continuous extension mechanism, to a lower part of the main tube unit. In a state where a seed chuck retreats into and is housed in a retreat/housing section provided below the wire in the main tube unit, a wiper member of an inner surface cleaning mechanism provided on an outer peripheral surface of an upper part of the main tube unit slides on an inner surface of the pull chamber while being in contact with the inner surface of the pull chamber and cleans the inner surface of the pull chamber. Accordingly, the main tube unit is inserted into the pull chamber, the upper part of the main tube unit where the inner surface cleaning mechanism is disposed is made to reach the vicinity of the top portion of the pull chamber by the continuous extension mechanism, the seed chuck is housed in the retreat/housing section formed in the main tube unit to be in a retreat state, and the cleaning of the inner surface of the pull chamber then can be performed by the inner surface cleaning mechanism. Therefore, it is possible to quickly and easily clean the inner surface of the pull chamber, which has been subjected to the pull of a semiconductor monocrystal, from the lower side of the pull chamber without using a large-scale device such as a carriage.

In a case where the main tube unit is to be inserted into the pull chamber, an axial position of the main tube unit is regulated with respect to a direction of a central axis of the pull chamber by a guide member of an axial position regulating mechanism provided at a lower part of the main tube unit of the invention. Accordingly, when the main tube unit is inserted into the pull chamber and the main tube unit is to be raised by the continuous extension mechanism until the inner surface cleaning mechanism reaches the vicinity of the top portion of the pull chamber, it is possible to prevent a damage to the inner surface of the pull chamber caused by the main tube unit and the generation of dust caused by the contact between the lower part of the main tube unit and the inner surface of the pull chamber that may occur in a case where the axial direction of the main tube unit is inclined and the lower part of the main tube unit is in contact with the inner surface of the pull chamber. Further, when the seed chuck is made to retreat to be housed in the retreat/housing section formed in the main tube unit, it is possible to prevent a damage to the seed chuck caused by the main tube unit and the generation of dust caused by the contact between the inner surface of the retreat/housing section and the seed chuck that may occur in a case where the axial direction of the main tube unit is inclined and the inner surface of the retreat/housing section is in contact with the seed chuck.

Advantageous Effects of Invention

According to the invention, the main tube unit is inserted into the pull chamber and a plurality of extension rods of the continuous extension mechanism are added and joined to each other in the axial direction. Accordingly, even though the pull chamber is present at a high position, the inner surface of the pull chamber can be cleaned to the lowest end of the pull chamber from the uppermost portion of the pull chamber by the inner surface cleaning mechanism in a retreat state where the seed chuck is housed in the retreat/housing section formed in the main tube unit. Therefore, since it is possible to quickly and easily clean the inner surface of the pull chamber, which has been subjected to the pull of a semiconductor monocrystal, from the lower side of the pull chamber without using a large-scale device such as a carriage, it is possible to obtain an effect of suppressing the influence (the dislocation of a crystal, and the like) of powder dust on pull and growth.

REFERENCE SIGNS LIST

1: monocrystalline pulling apparatus
1a: pull chamber
1b: pull head
1c: winding device
1d: centerpiece portion
1f: pull head suction pipe
1g: pull head suction unit
2: chamber
W: wire
SH: seed holder
SC: seed chuck
10: cleaning device
11: main tube unit
11a, 11b, 11c, 11d: flange portion
12: retreat/housing section
12a: bottom
13: continuous extension mechanism
13A to 13D: extension rod
13Ba, 13Ca, 13Da: connecting recess
13Ab, 13Bb, 13Cb, 13Db: connecting protrusion
13a: locking unit
14: locking unit
14a: hook
14b: base
14c: lever
14d: catch
15: axial position regulating mechanism
16: guide member
17: inner surface cleaning mechanism
18, 18A: wiper member
18B: second wiper member
18a. 18b: end portion
18c: inner joint portion
18d, 18e: folded portions
23: wiper activating mechanism
23B: wiper activating mechanism
24: rubber tube (flexible bag body)
24B: rubber tube (flexible bag body)
25: pressurization pipe
26: pressurized-air supply source
33: external nozzle (external blowing port)
33c: blowing-air supply pipe
33d: valve
33e: particle filter
33f: mist oil filter
33g: coupler

BEST MODE FOR CARRYING OUT THE INVENTION

A first embodiment of a device for cleaning a monocrystalline pulling apparatus according to the invention will be described below with reference to drawings.

Figure 1:
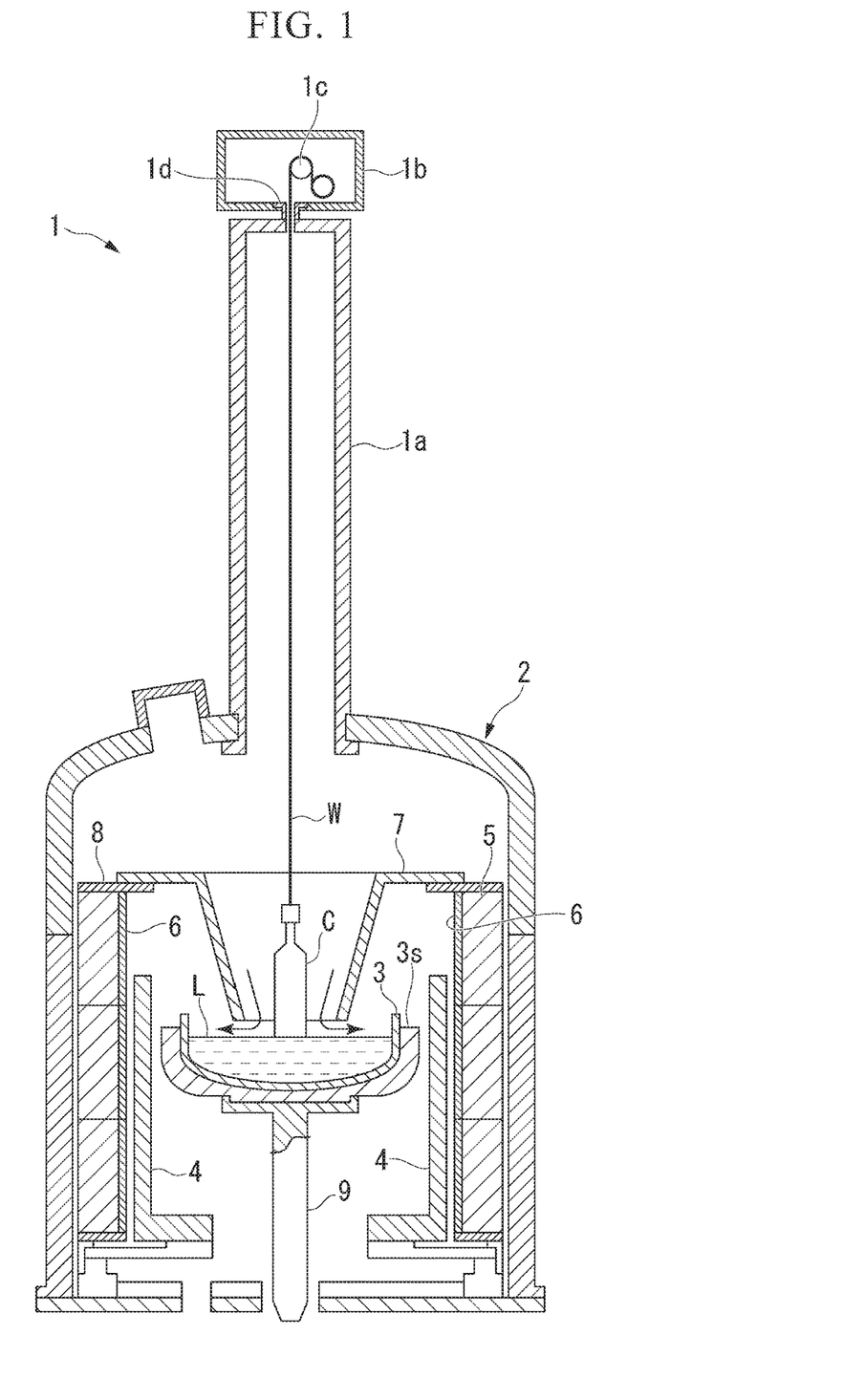
FIG. 1 is a front cross-sectional view of a monocrystalline pulling apparatus, which is to be cleaned, in a first embodiment of a device for cleaning a monocrystalline pulling apparatus according to the invention.

FIG. 1 is a front cross-sectional view of a monocrystalline pulling apparatus that is to be cleaned by a cleaning device of this embodiment, and reference numeral 1 denotes the monocrystalline pulling apparatus in FIG. 1.

The monocrystalline pulling apparatus 1 according to this embodiment is to perform pull and growth using Czochralski (CZ) method. As shown in FIG. 1, the monocrystalline pulling apparatus 1 according to this embodiment includes a chamber 2 that is a sealed vessel, a pull chamber 1a that is provided at an upper portion of the chamber 2, a susceptor 3s that is provided in the chamber 2 and is made of carbon, a quartz crucible 3 that is disposed on the susceptor 3s, a cylindrical heater 4 that is disposed around the quartz crucible 3 and is made of carbon, a cylindrical heat-insulating tube 5 that is disposed around the heater 4 made of carbon, a carbon plate 6 that is provided on the inner surface of the heat-insulating tube 5 as a support plate, a flow pipe 7 that is disposed above the quartz crucible 3, an annular upper ring 8 that supports the flow pipe 7, and a shaft 9 that supports the susceptor 3s and is movable up and down.

The monocrystalline pulling apparatus 1 further includes a wire W that is suspended in the pull chamber 1a and is made of tungsten (W) or the like, and a winding device 1c for the wire W is provided in a pull head 1b that is rotatably provided on the pull chamber 1a. The wire W is suspended into the pull chamber 1a from the pull head 1b through a centerpiece portion 1d that is a hole allowing the pull head 1b and the pull chamber 1a to communicate with each other.

Figure 2:
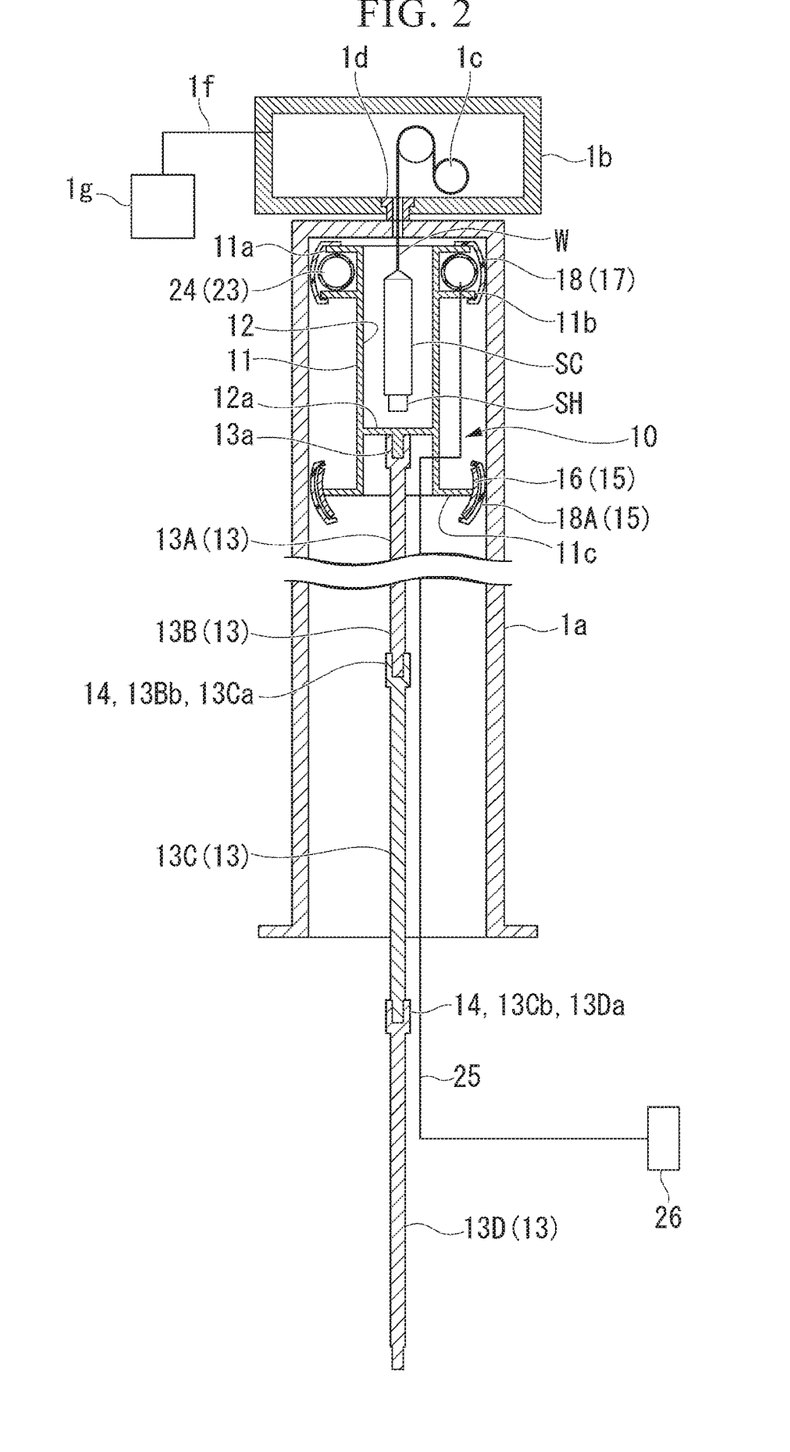
FIG. 2 is a front cross-sectional view showing a state where a main tube unit is inserted into a pull chamber in the first embodiment of the device for cleaning a monocrystalline pulling apparatus according to the invention.

As shown in FIG. 2, a seed holder SH that holds a seed crystal and is made of carbon and a seed chuck SC that is made of molybdenum are mounted at the lower end of the wire W. Further, a pull head suction unit 1g is connected to the pull head 1b through a pull head suction pipe 1f, so that pressure in the pull head 1b can be reduced.

To perform pull and growth by the monocrystalline pulling apparatus 1, first, the chamber 2 is opened and the quartz crucible 3 is filled with a semiconductor material, such as silicon, forming semiconductor melt L. Then, after the chamber 2 is sealed and predetermined gas atmosphere is set in the chamber 2, heating is performed up to a predetermined temperature by the heater 4 to melt the semiconductor material, the semiconductor melt L is stored in the quartz crucible 3, and the heating of the semiconductor melt L up to a predetermined temperature is controlled by the heater 4. In this state, a semiconductor monocrystal C is pulled from the semiconductor melt L, which is stored in the crucible 3 disposed below the pull chamber 1a, by the wire W that is suspended in the pull chamber 1a provided at the upper portion of the chamber 2. The pulled semiconductor monocrystal C is taken out and sent to a process for manufacturing a wafer, and the like. After the pull ends, the pull chamber 1a is detached from the chamber 2 and is cleaned by the cleaning device of this embodiment.

Figure 3:
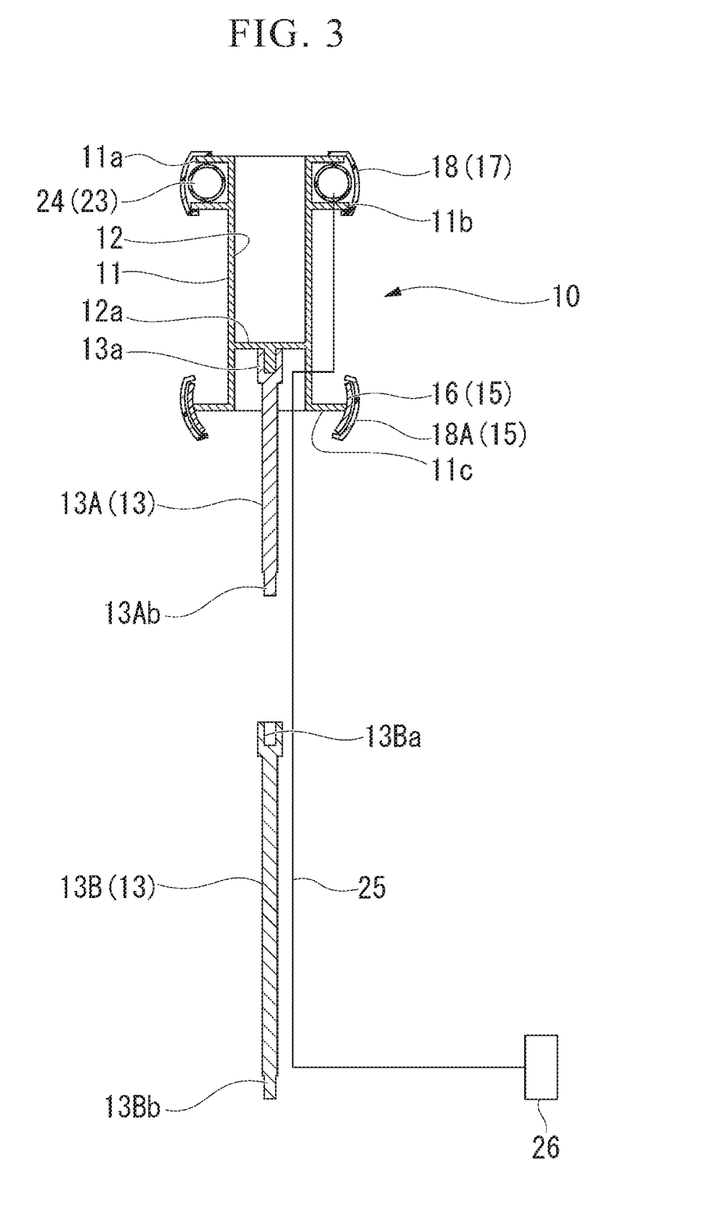
FIG. 3 is an exploded front cross-sectional view showing the main tube unit and a continuous extension mechanism in the first embodiment of the device for cleaning a monocrystalline pulling apparatus according to the invention.

FIG. 2 is a front cross-sectional view showing a state where a main tube unit of the cleaning device of this embodiment is joined and is inserted into the pull chamber, FIG. 3 is an exploded front cross-sectional view showing the main tube unit and a continuous extension mechanism of the cleaning device of this embodiment, and reference numeral 10 denotes the cleaning device in the drawings.

As shown in FIGS. 2 and 3, the cleaning device 10 of this embodiment includes a main tube unit 11 that can be inserted into the pull chamber 1a and can house the wire W therein, an inner surface cleaning mechanism 17 that is provided at an upper part of the main tube unit 11 and cleans the inner surface of the pull chamber 1a, and a continuous extension mechanism 13 that is provided at a lower part of the main tube unit 11 and is formed of a plurality of extension rods 13A to 13D to be capable of being added and joined.

The main tube unit 11 is made of a lightweight resin or the like, for example, vinyl chloride. As shown in FIGS. 2 and 3, the main tube unit 11 is formed in the shape of a cylinder of which the upper end is opened and is provided with a retreat/housing section 12 that houses the wire W, the seed holder SH, and the seed chuck SC therein. The length of the retreat/housing section 12 in an axial direction may be equal to or longer than a length that allows the seed holder SH forming the lowest end of the wire W not to be in contact with a bottom 12a of the retreat/housing section 12 in a state where the wire W is wound during cleaning.

In the retreat/housing section 12, the bottom 12a is provided at a position slightly lower than the middle in the axial direction of the main tube unit 11 as shown in FIGS. 2 and 3. However, the bottom 12a may be provided at the position of the lowest end of the main tube unit 11 or may also be provided at other axial position so as to correspond to a height position relationship between the upper end of the pull chamber 1a and the seed holder SH.

The lower part of the main tube unit 11 is closed by the bottom 12a of the retreat/housing section 12, and the extension rod 13A of the continuous extension mechanism 13 is coaxially provided on the lower surface of the bottom 12a so as to extend downward.

The extension rod 13A is connected to the bottom 12a in a vertical direction and a direction coinciding with the direction of the central axis of the main tube unit 11 by a connecting portion 13a that is provided at the central position of the bottom 12a.

The connecting portion 13a is adapted to allow the bottom 12a and the extension rod 13A to be connected to each other, and can be adapted so that, for example, a male screw portion provided on the bottom 12a and a female screw portion provided at the upper end of the extension rod 13A are threadedly engaged with each other. As long as the connecting portion 13a is adapted to be capable of connecting the bottom 12a to the extension rod 13A, the structure of the connecting portion 13a is not limited thereto.

The continuous extension mechanism 13 includes the extension rods 13A to 13D, and is adapted so that the extension rods 13A to 13D are connected to each other in the axial direction to be capable of adjusting a height position where the main tube unit 11 reaches.

The extension rods 13A to 13D are made of a lightweight resin or the like, for example, vinyl chloride, and have a quadripartite structure including a first extension rod 13A, a second extension rod 13B, a third extension rod 13C, and a fourth extension rod 13D that can be repeatedly joined to and detached from each other in the axial direction and are arranged in this order from above as shown in FIGS. 2 and 3.

The extension rods 13B to 13D have substantially the same shape.

The number of divided extension rods can be set according to the diameter and length of a semiconductor monocrystal C that is to be pulled by the monocrystalline pulling apparatus 1, the length of the pull chamber 1a, and the lengths of the extension rods 13A to 13D that are easy to use.

As shown in FIGS. 2 and 3, a connecting protrusion 13Ab is provided at the lower end of the extension rod 13A, a connecting recess 13Ba is provided at the upper end of the extension rod 13B, and a connecting unit 14 is provided at the lower end of the extension rod 13A and the upper end of the extension rod 13B.

The connecting unit 14 is adapted to allow the lower end of the extension rod 13A and the upper end of the extension rod 13B to be connected to each other.

Figure 4:
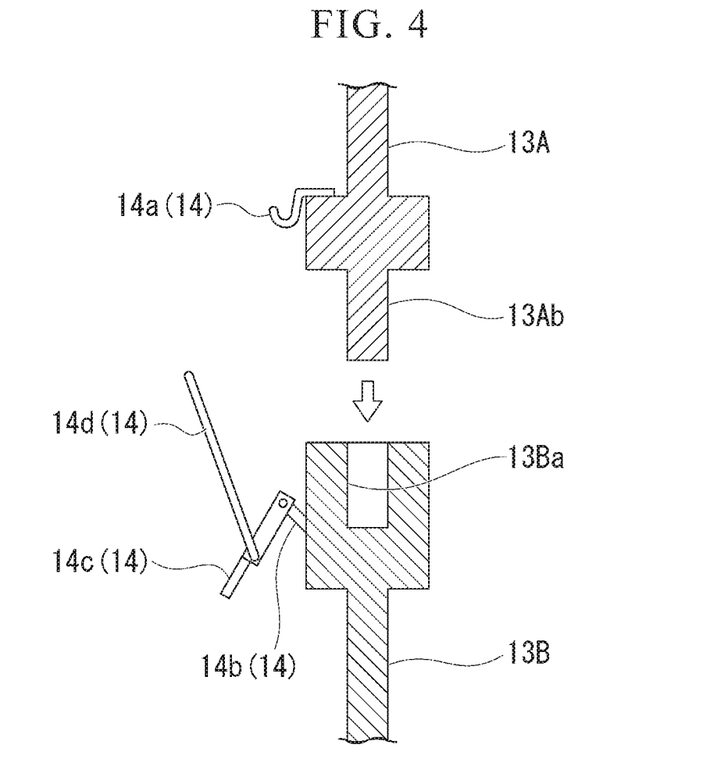
FIG. 4 is an enlarged cross-sectional view showing a state where another example of the continuous extension mechanism is separated in the first embodiment of the device for cleaning a monocrystalline pulling apparatus according to the invention.
Figure 5:
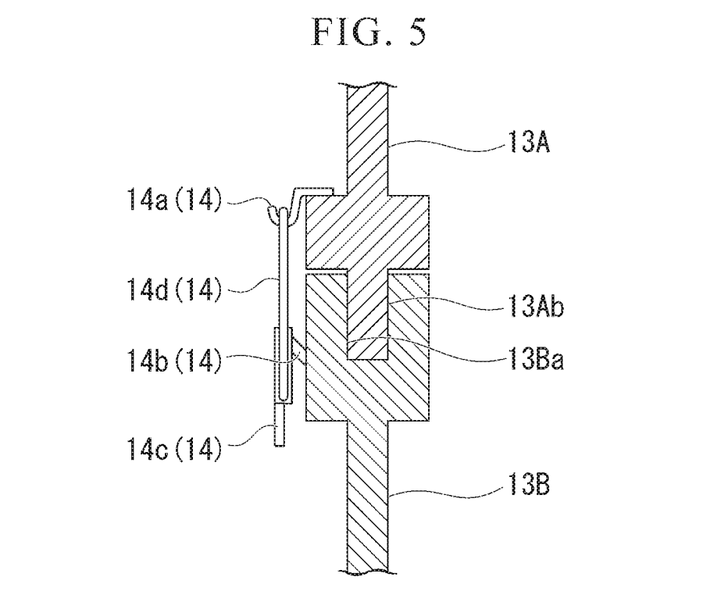
FIG. 5 is an enlarged cross-sectional view showing a state where another example of the continuous extension mechanism is connected in the first embodiment of the device for cleaning a monocrystalline pulling apparatus according to the invention.

FIG. 4 is a front cross-sectional view showing a state where an example of the locking unit of the cleaning device of this embodiment is unlocked, and FIG. 5 is a front cross-sectional view showing a state where the example of the locking unit of the cleaning device of this embodiment is locked.

As shown in FIGS. 4 and 5, the locking unit 14 is adapted to allow the lower end of the extension rod 13A and the upper end of the extension rod 13B to be locked to and unlocked from each other, and is formed of a so-called draw latch.

As shown in FIGS. 2 to 5, the locking unit 14 is disposed on the extension rods 13A and 13B at the same position in the circumferential direction.

As shown in FIGS. 4 and 5, the draw latch (locking unit) 14 includes a hook 14a that is provided on the extension rod 13A and a base 14b, a lever 14c, and a catch 14d that are provided on the extension rod 13B.

The hook 14a is provided at the position of the lower end of the extension rod 13A. The base 14b is provided at the position of the upper end of the extension rod 13B.

The base 14b and the lever 14c are connected to each other so as to be rotatable about an axis, and the catch 14d and the lever 14c are connected to each other so as to be rotatable about an axis. The catch 14d is adapted to be elastically deformable for locking.

In a case where the catch 14d is to be engaged with the hook 14a in the draw latch (locking unit) 14 as shown in FIGS. 4 and 5, a force is applied to the lever 14c from the upper side to rotate the lever 14c with respect to the base 14b and the extension rods 13A and 13B are drawn to a locking position together by the catch 14d. Basically, a latch operation is to rotate the lever 14c to shift the pivot-connecting portion between the catch 14d and the lever 14c from a line between the hook 14*a* and the pivot-connecting portion between the lever 14*c* and the base 14*b*.

The connecting unit (locking unit) 14 may be adapted to lock the extension rods 13A and 13B at one position in the circumferential direction as shown in FIGS. 4 and 5, or may also be adapted to lock the extension rods 13A and 13B at two positions (both sides) or more so that stability is further increased.

In addition, as long as the extension rods 13A and 13B can be separated from and connected to each other, the structure of the connecting unit 14 is not limited thereto. For example, a male screw portion provided at the lower end of the extension rod 13A and a female screw portion provided at the upper end of the extension rod 13B can be adapted to be threadedly engaged each other.

Likewise, a connecting protrusion 13Bb is provided at the lower end of the extension rod 13B, a connecting recess 13Ca is provided at the upper end of the extension rod 13C, and the connecting unit 14 is provided at the lower end of the extension rod 13B and the upper end of the extension rod 13C.

Likewise, the connecting protrusion 13Bb, the connecting recess 13Ca, and the connecting unit 14 are also adapted to allow the lower end of the extension rod 13B and the upper end of the extension rod 13C to be connected to each other.

Likewise, a connecting protrusion 13Cb is provided at the lower end of the extension rod 13C, a connecting recess 13Da is provided at the upper end of the extension rod 13D, and the connecting unit 14 is provided at the lower end of the extension rod 13C and the upper end of the extension rod 13D.

Likewise, the connecting protrusion 13Cb, the connecting recess 13Da, and the connecting unit 14 are also adapted to allow the lower end of the extension rod 13C and the upper end of the extension rod 13D to be connected to each other.

These form the continuous extension mechanism 13.

As shown in FIGS. 2 and 3, the upper part of the main tube unit 11 is provided with a wiper member 18 that is disposed on the outer peripheral surface of the upper end of the main tube unit 11 and can be in contact with the inner surface of the pull chamber 1*a* in a state where the main tube unit 11 is inserted into the pull chamber 1*a*.

Figure 6:
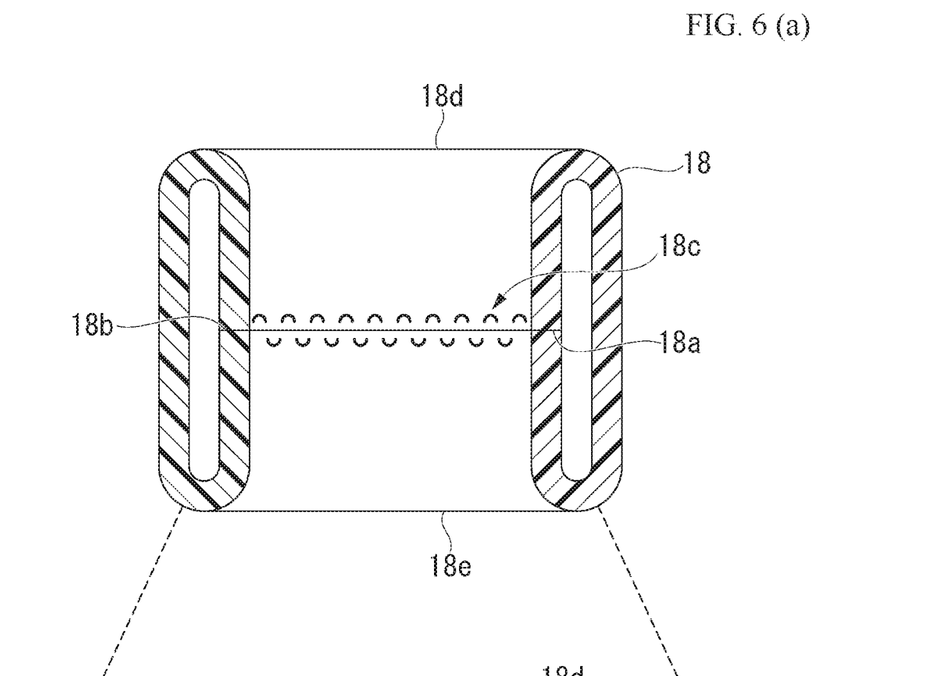
FIG. 6(a) is a cross-sectional view showing the reduced-diameter state of a wiper member and FIG. 6(b) is a cross-sectional view showing the increased-diameter state of the wiper member in the first embodiment of the device for cleaning a monocrystalline pulling apparatus according to the invention.

FIG. 6(*a*) is a cross-sectional view showing the reduced-diameter state of the wiper member of the cleaning device of this embodiment and FIG. 6(*b*) is a cross-sectional view showing the increased-diameter state of the wiper member.

Further, the wiper member 18 is made of polyester or the like, and is doubly folded back so as to form an annular shape along the inner peripheral surface of the pull chamber 1*a*. Specifically, the wiper member 18 is formed of, for example, an elastic cloth body that is knitted in a tubular shape by a circular knitting machine or the like. The wiper member 18 is folded back inward so that both end portions 18*a* and 18*b* of the tubular cloth body face each other as shown in FIG. 6(*a*), and is formed in a toroidal shape (annular shape) through an inner joint portion 18*c* where these end portions 18*a* and 18*b* are elastically connected to each other.

In this case, portions of the tubular cloth body positioned near both folded portions 18*d* and 18*e* are mounted on the outer peripheral end portions of upper and lower flange portions 11*a*, 11*b* in a state where the inner joint portion 18*c* faces the inside of a torus not being in contact with the inner surface of the pull chamber 1*a*.

The wiper member 18 can cope with a pull chamber 1*a* having a different diameter.

For example, in a case where the wiper member 18 is to be applied to clean the pull chamber 1*a* having a small diameter as in a monocrystalline pulling apparatus 1 for pulling a semiconductor monocrystal C having a diameter of φ200 mm, the wiper member 18 is used in the reduced-diameter state where both the end portions 18*a* and 18*b* are connected to each other through the inner joint portion 18*c* as shown in FIG. 6(*a*).

In addition, in a case where the wiper member 18 is to be applied to clean a pull chamber 1*a* having a large diameter as in a monocrystalline pulling apparatus 1 for pulling a semiconductor monocrystal C having a diameter of, for example, φ300 mm, the wiper member 18 is used in the increased-diameter state where the joining between the end portions 18*a* and 18*b* through the inner joint portion 18*c* is released to increase an elastic modulus and to increase the width as shown in FIG. 6(*b*). In this case, the wiper member 18 can also be used as one layer over the entire width thereof.

The wiper member 18 serves as the inner surface cleaning mechanism 17, and can remove adhering powder dust and the like while sliding on the inner surface of the pull chamber 1*a*.

The main tube unit 11 includes a wiper activating mechanism 23 that deforms or moves the wiper member 18 in the radial direction of the main tube unit 11.

The wiper activating mechanism 23 includes a rubber tube (flexible bag body) 24 that is provided between the wiper member 18 and the outer peripheral surface of the upper end of the main tube unit 11 and is provided in an annular shape along the outer peripheral surface of the upper end portion of the main tube unit 11.

As shown in FIGS. 2 and 3, the rubber tube 24 is put between the two flange portions 11*a* and 11*b* provided at the upper end of the main tube unit 11, and the wiper member 18 is mounted on the two flange portions 11*a* and 11*b* in a state where the wiper member 18 is loose vertically. The wiper member 18 may be directly provided on the outer peripheral surface of the rubber tube 24. Further, a pressurization pipe 25 is connected to the rubber tube 24, and is connected to a pressurized-air supply source 26. That is, since air is injected into the rubber tube 24 from the pressurized-air supply source 26 through the pressurization pipe 25, the rubber tube 24 can be inflated arbitrarily.

As shown in FIGS. 2 and 3, an axial position regulating mechanism 15 is provided at the lower part of the main tube unit 11.

The axial position regulating mechanism 15 includes a guide member 16 that is provided around the outer peripheral surface of the lower end of the main tube unit 1, and a wiper member 18A that covers the outer peripheral surface of the guide member 16.

The guide member 16 is provided at the outer peripheral end portion of a flange portion 11*c* provided around the lower end of the main tube unit 11, and allows only the wiper member 18 to be in contact with the inner surface of the pull chamber 1*a* in a case where the main tube unit 11 is to be inserted into the pull chamber 1*a* and a case where the main tube unit 11 is to be moved up and down in the pull chamber 1*a*. For this purpose, the diameter of the guide member 16 at the outermost peripheral position is set to a diameter that is substantially equal to or smaller than the diameter of the wiper member 18.

Further, the outer peripheral shape of the guide member 16 is formed so that the diameter of the guide member 16 is increased toward the wiper member 18 (upper side) from the extension rod 13B (lower side). Furthermore, since the upper and lower ends of the outer periphery of the guide member 16 are bent toward the central axis of the main tube unit 11, the outer periphery of the guide member 16 has a shape that is similar to the shape of the outer peripheral surface of the lower portion of a torus as a whole.

Further, the guide member 16 is formed substantially in the shape of a ring, of which the diameter is smaller than the diameter of the inner peripheral surface of the pull chamber 1a, along the inner peripheral surface of the pull chamber 1a. However, the guide member 16 does not need to be provided over the entire length in the circumferential direction and may be discontinuously provided in the circumferential direction. Particularly, since the weight of the guide member is reduced in a case where the guide member 16 is formed not to be continuous as a whole, a reduction in weight can be achieved.

Since the guide member 16 has a diameter slightly smaller than the diameter of the wiper member 18, the guide member 16 can make the posture of the main tube unit 11 with respect to the pull chamber 1a, that is, an angle between the axis of the main tube unit 11 and the axis of the pull chamber 1a be in a predetermined range. Accordingly, since the main tube unit 11 is not inclined with respect to the central axis of the pull chamber 1a more than necessary, the axial position (posture) of the main tube unit 11 can be maintained during cleaning from the time of insertion and until the time of takeout.

If the main tube unit 11 is inclined, there is a possibility that a difference in contact pressure may occur depending on a position in the circumferential direction in a case where the wiper member 18 is in contact with the inner surface of the pull chamber 1a over the entire circumference thereof during cleaning. As a result, there is a possibility that a difference in a cleaning action may occur depending on a position in the circumferential direction. In this embodiment, the axial position of the main tube unit 11 is regulated with respect to the direction of the central axis of the pull chamber 1a by the guide member 16 in a state where the main tube unit 11 is inserted into the pull chamber 1a. Accordingly, an effect of performing uniform cleaning in the circumferential direction is obtained.

The entire outer peripheral surface of the guide member 16 is covered with the wiper member 18A. The wiper member 18A is formed of substantially the same wiper member as the wiper member 18 that is mounted on the flange portions 11a and 11b positioned at the upper part of the main tube unit 11.

Next, a method of cleaning the inner surface of the pull chamber 1a of the monocrystalline pulling apparatus 1 by the cleaning device 10 of this embodiment will be described.

First, a main body portion of the chamber 2 and the upper portion are separated from each other, and the main tube unit 11 is prepared below the pull chamber 1a. Since air is not supplied to the rubber tube 24 from the pressurized-air supply source 26 through the pressurization pipe 25 in this case, the rubber tube 24 is not inflated.

Then, the main tube unit 11 of the cleaning device 10 is inserted into the pull chamber 1a.

After that, the extension rod 13B is disposed below the lower end of the extension rod 13A in a state where the main tube unit 11 is inserted as described above. In this state, the upper end of the extension rod 13B is made to be in contact with the lower end of the extension rod 13A, the connecting protrusion 13Ab is inserted into the connecting recess 13Ba. and the upper end of the extension rod 13B is connected to the lower end of the extension rod 13A by the locking unit 14.

In addition, the extension rods 13A and 13B, which are integrated with each other in the same way as described above in a state where the main tube unit 11 is inserted into the pull chamber 1a, are raised together.

Then, the extension rod 13C is disposed below the lower end of the extension rod 13B in a state where the main tube unit 11 is inserted as described above. In this state, the upper end of the extension rod 13C is made to be in contact with the lower end of the extension rod 13B, the connecting protrusion 13Bb is inserted into the connecting recess 13Ca, and the upper end of the extension rod 13C is connected to the lower end of the extension rod 13B by the locking unit 14.

In addition, the extension rods 13A to 13C, which are integrated with each other in the same way as described above in a state where the main tube unit 11 is inserted into the pull chamber 1a, are raised together.

After that, the extension rod 13D is disposed below the lower end of the extension rod 13C in a state where the main tube unit 11 is inserted as described above. In this state, the upper end of the extension rod 13D is made to be in contact with the lower end of the extension rod 13C, the connecting protrusion 13Cb is inserted into the connecting recess 13Da. and the upper end of the extension rod 13D is connected to the lower end of the extension rod 13C by the locking unit 14.

In addition, the extension rods 13A to 13D, which are integrated with each other in the same way as described above in a state where the main tube unit 11 is inserted into the pull chamber 1a, are raised together.

Accordingly, the main tube unit 11 is extended up to the maximum length in a height direction as shown in FIG. 2 by the extension rods 13A to 13D that are the continuous extension mechanism 13.

In this case, the seed chuck SC and the seed holder SH are mounted at the lower end of the wire W suspended from the top portion in the pull chamber 1a as shown in FIG. 2, but are in a retreat state where the seed chuck SC and the seed holder SH are housed in the retreat/housing section 12. For this reason, since the wire W, the seed chuck SC, and the seed holder SH are not in contact with the main tube unit 11 even in a case where the main tube unit 11 is made to reach the top portion of the pull chamber 1a, the generation of dust from the wire W and the like can be prevented.

In this state, air is sent to the rubber tube 24 from the pressurized-air supply source 26 through the pressurization pipe 25 and inflates the rubber tube 24. In this case, the wiper member 18 is deformed so as to be extruded outward in the radial direction by the inflated rubber tube 24, and is pressed against the inner peripheral surface of the pull chamber 1a. In a case where a worker gripping the lower end portion of the extension rod 13D moves the main tube unit 11 up and down relative to the pull chamber 1a in that state, the wiper member 18 can slide on the inner peripheral surface of the pull chamber 1a and wipe off adhering matter.

Moreover, in a case where the amount of matter adhering to the inner peripheral surface of the pull chamber 1a is large, and the like, if necessary, the locking unit 14 is unlocked to separate the extension rod 13D from the extension rod 13C and a worker gripping the lower end portion of the extension rod 13C moves the main tube unit 11 up and down relative to the pull chamber 1a so that the wiper member 18 can slide on the inner peripheral surface of the pull chamber 1a at a low position and wipe off adhering matter.

Likewise, if necessary, the locking unit 14 is unlocked to separate the extension rod 13C from the extension rod 13B and a worker gripping the lower end portion of the extension rod 13B moves the main tube unit 11 up and down relative to the pull chamber 1a so that the wiper member 18 can slide on the inner peripheral surface of the pull chamber 1a at a low position and wipe off adhering matter.

Likewise, if necessary, the locking unit 14 is unlocked to separate the extension rod 13B from the extension rod 13A and a worker gripping the lower end portion of the extension rod 13A moves the main tube unit 11 up and down relative to the pull chamber 1a so that the wiper member 18 can slide on the inner peripheral surface of the pull chamber 1a at a low position and wipe off adhering matter.

Since it is possible to separate the wiper member 18 from the inner peripheral surface of the pull chamber 1a by deflating the rubber tube 24 in cases other than a case where the inside of the main tube unit 11 is to be wiped to perform cleaning, it is possible to smoothly insert the main tube unit 11 into the pull chamber 1a or to smoothly take the main tube unit 11 out of the pull chamber 1a without the obstruction of the wiper member 18 in a case where the main tube unit 11 is to be inserted into and set in the pull chamber 1a or is to be taken out of the pull chamber 1a.

Further, in a state where the main tube unit 11 is inserted into the pull chamber 1a, the axial position of the main tube unit 11 is regulated with respect to the direction of the central axis of the pull chamber 1a by the guide member 16 of the axial position regulating mechanism 15, so that only the wiper member 18 can be in contact with the inner surface of the pull chamber 1a and uniform cleaning in the circumferential direction of the wiper member 18 is performed.

Furthermore, since the guide member 16 prevents the main tube unit 11 from being inclined with respect to the central axis of the pull chamber 1a than necessary, the axial position (posture) of the main tube unit 11 can be maintained during cleaning from the time of insertion and until the time of takeout.

Further, since the posture of the main tube unit 11 is maintained in a case where the extension rods 13B to 13D are to be connected and separated or even in a case where the extension rods 13B to 13D are likely to be elastically deformed since being reduced in weight, it is possible to prevent portions other than the wiper members 18 and 18A from being in contact with the inner surface of the pull chamber 1a.

As described above, in the cleaning device 10 of this embodiment, even though the pull chamber 1a is present at a high position, the main tube unit 11 is made to reach the high position by the continuous extension mechanism 13 and the wiper member 18 can be made to slide over the entire length of the pull chamber 1a in a state where the posture of the main tube unit 11 is maintained by the axial position regulating mechanism 15. Accordingly, the wiper member 18 can scrape adhering matter off by scraping the inner peripheral surface of the pull chamber 1a. Therefore, it is possible to effectively suppress the influence (the dislocation of a crystal, and the like) of powder dust on pull and growth.

In the cleaning device 10 of this embodiment, the main tube unit 11 and the extension rod 13B are inserted into the pull chamber 1a and the extension rods 13B to 13D setting the height of the main tube unit 11 can be separated from and joined to each other. Accordingly, the handleability, such as cleaning, transport, and storage, of the cleaning device is improved. According to this structure, it is possible to quickly and easily clean the inner surface of the pull chamber 1a, which has been subjected to the pull of a semiconductor monocrystal, from the lower side of the pull chamber without using a large-scale device such as a carriage. Accordingly, since the inner surface of the pull chamber 1a can be cleaned whenever the pull ends, it is possible to obtain an effect of suppressing the influence (the dislocation of a crystal, and the like) of powder dust on pull and growth.

The quartz crucible 3 can be filled with a silicon raw material during the cleaning of the inner surface of this embodiment, and the pull chamber 1a and the chamber 2 can also be assembled after cleaning.

Next, a second embodiment of the device for cleaning a monocrystalline pulling apparatus according to the invention will be described with reference to drawings.

Figure 7:
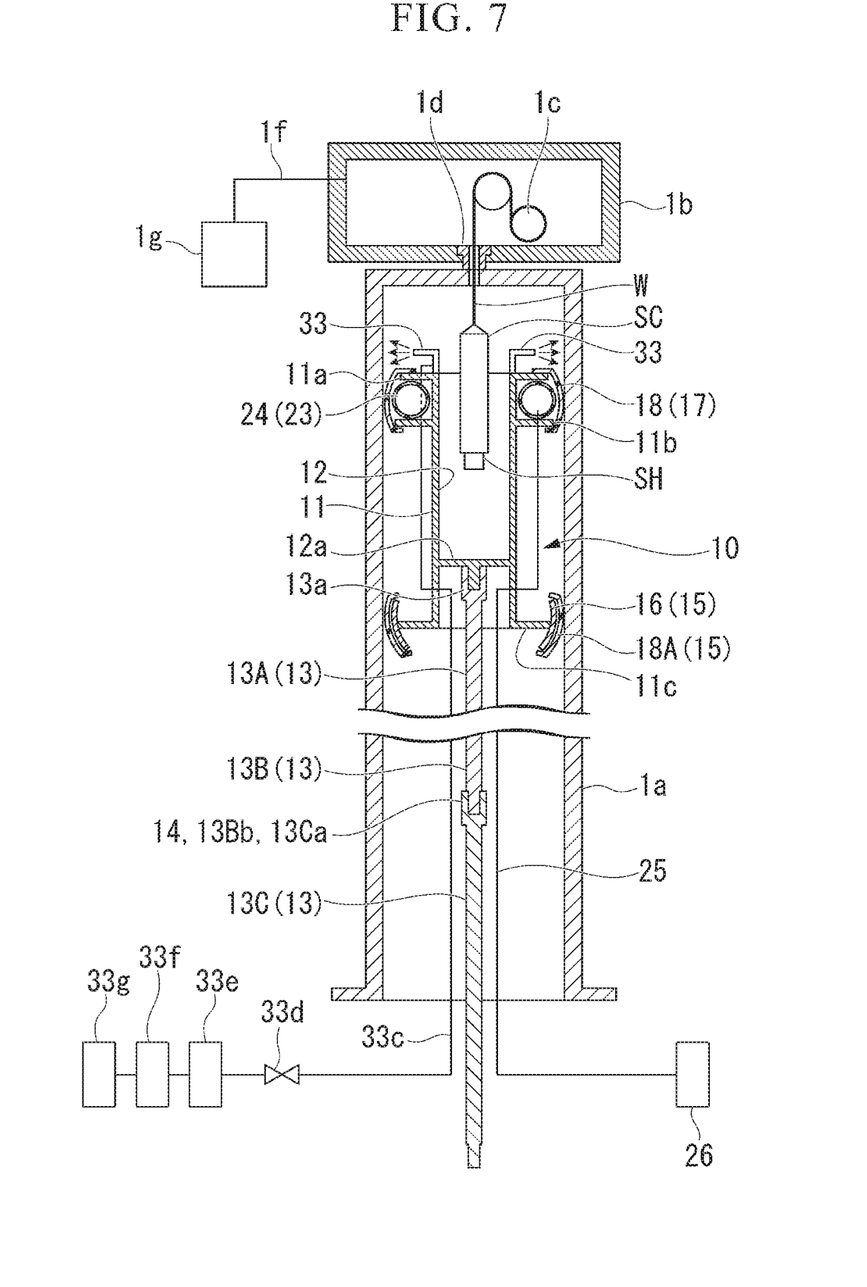
FIG. 7 is a front cross-sectional view showing a state where a main tube unit is inserted into a pull chamber in a second embodiment of the device for cleaning a monocrystalline pulling apparatus according to the invention.

FIG. 7 is a front cross-sectional view showing a state where a main tube unit of this embodiment is inserted into the pull chamber 1a.

This embodiment is different from the above-mentioned first embodiment in terms of external nozzles (external blowing ports) 33. Corresponding components other than the external nozzles 33 will be denoted by the same reference numerals as those of the first embodiment, and the description thereof will be omitted.

As shown in FIG. 7, the cleaning device 10 of this embodiment includes an external air blowing mechanism including a plurality of external nozzles (external blowing ports) 33 that are provided at the upper portion of the main tube unit 11 and can blow air to the outside in the radial direction.

In this embodiment, the respective external nozzles 33 are connected to a blowing-air supply pipe 33c, a particle filter 33e and a mist oil filter 33f are provided on an intermediate portion of the blowing-air supply pipe 33c through a valve 33d, and a coupler 33g to be connected to an air supply source (not shown) for cleaning is provided at a base end of the blowing-air supply pipe.

The external nozzles 33 can blow matter, which adheres to the inner surface of the pull chamber 1a, off by blowing jetted air to the inner peripheral surface of the pull chamber 1a.

A third embodiment of the device for cleaning a monocrystalline pulling apparatus according to the invention will be described with reference to a drawing.

Figure 8:
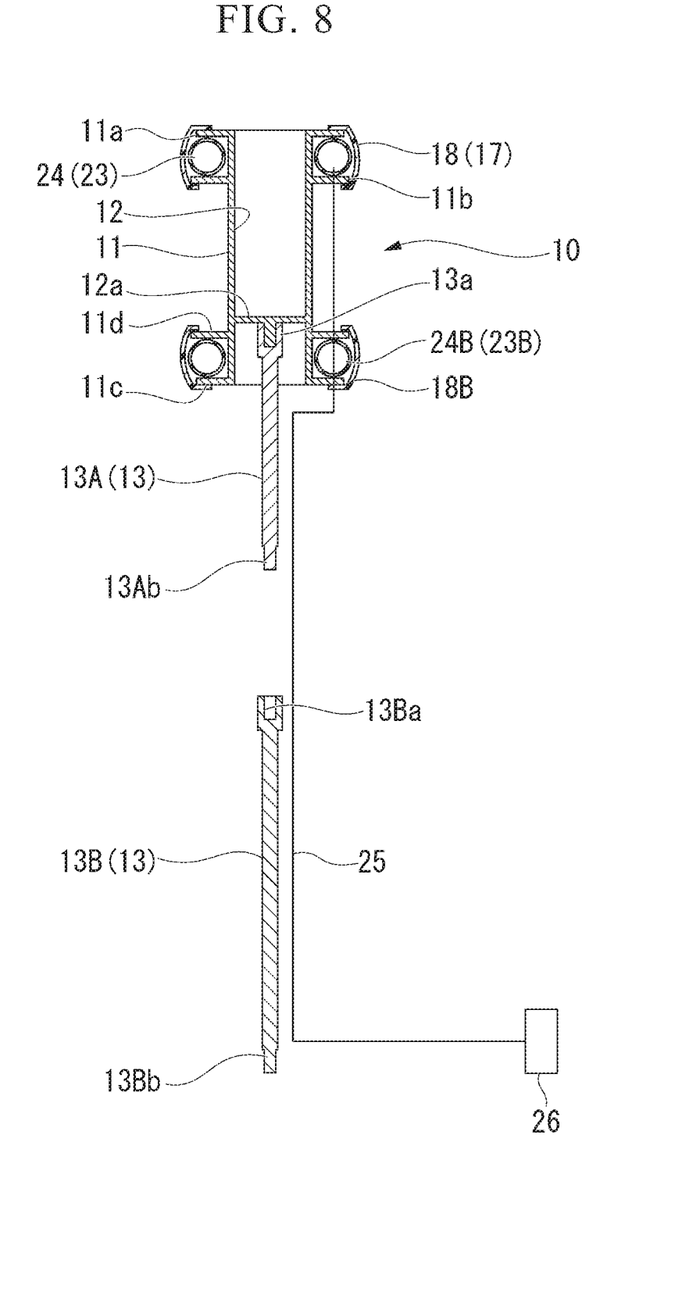
FIG. 8 is an exploded front cross-sectional view showing a main tube unit and a continuous extension mechanism in a third embodiment of the device for cleaning a monocrystalline pulling apparatus according to the invention.

FIG. 8 is an exploded front cross-sectional view showing a main tube unit and a continuous extension mechanism of a cleaning device of this embodiment.

This embodiment is different from the above-mentioned first and second embodiments in terms of a second wiper member 18B of the inner surface cleaning mechanism 17, a wiper activating mechanism 23B, and a rubber tube (flexible bag body) 24B. Corresponding components other than the second wiper member 18B of the inner surface cleaning mechanism 17, the wiper activating mechanism 23B, and the rubber tube 24B will be denoted by the same reference numerals as those of the first and second embodiments, and the description thereof will be omitted.

As shown in FIG. 8, the lower portion of a main tube unit 11 of this embodiment is provided with the wiper member 18B that is disposed on the outer peripheral surface of the lower end of the main tube unit 11 and can be in contact with the inner surface of the pull chamber 1a in a state where the main tube unit 11 is inserted into the pull chamber 1a. That is, the main tube unit 11 includes the second wiper member 18B provided on the outer peripheral surface of the lower end thereof in addition to the wiper member 18 provided on the outer peripheral surface of the upper end thereof, and performs cleaning at two circumferential positions.

The wiper member 18B is formed of a wiper member equivalent to the wiper member 18, and a cleaning mechanism, which can remove adhering powder dust and the like while sliding on the inner surface of the pull chamber 1a, is used as the inner surface cleaning mechanism 17.

The main tube unit 11 includes the wiper activating mechanism 23B that deforms or moves the wiper member 18 in the radial direction of the main tube unit 11.

The wiper activating mechanism 23B includes a rubber tube (flexible bag body) 24B that is provided between the wiper member 18B and the outer peripheral surface of the lower end of the main tube unit 11 and is provided in an annular shape along the outer peripheral surface of the lower end portion of the main tube unit 11.

The rubber tube 24B is put between two flange portions 11c and 11d provided at the lower end of the main tube unit 11, and the wiper member 18B is mounted on the two flange portions 11c and 11d in a state where the wiper member 18B is loose vertically. The wiper member 18B may be directly provided on the outer peripheral surface of the rubber tube 24B. Further, the rubber tube 24B is connected to the pressurization pipe 25 as with the rubber tube 24. That is, since air is injected into the rubber tube 24B from the pressurized-air supply source 26 through the pressurization pipe 25, the rubber tube 24B can be inflated arbitrarily as with the rubber tube 24.

Only the wiper members 18 and 18B can be in contact with the inner surface of the pull chamber 1a in a case where the main tube unit 11 is inserted into the pull chamber 1a and a case where the main tube unit 11 is to be moved up and down in the pull chamber 1a. For this purpose, the diameter of the wiper member 18B at the outermost peripheral position is set to be substantially equal to the diameter of the wiper member 18.

As with the guide member 16, the wiper member 18B can make the posture of the main tube unit 11 with respect to the pull chamber 1a, that is, an angle between the axis of the main tube unit 11 and the axis of the pull chamber 1a be in a predetermined range. Specifically, since the main tube unit 11 is in contact with the pull chamber 1a over the entire circumference at two positions of the upper and lower ends thereof, the main tube unit 11 is little inclined with respect to the central axis of the pull chamber 1a and the axial position (posture) of the main tube unit 11 can be maintained during cleaning from the time of insertion and until the time of takeout.

Since the wiper member 18B also acts as the axial position regulating mechanism 15 and regulates the axial position of the main tube unit 11 with respect to the direction of the central axis of the pull chamber 1a in a state where the main tube unit 11 is inserted into the pull chamber 1a, an effect of performing uniform cleaning in the circumferential direction is obtained.

Further, the wiper member 18B serves as the inner surface cleaning mechanism 17 and can slide on the inner peripheral surface of the pull chamber 1a at two upper and lower positions in an annular shape and wipe off adhering matter.

In the invention, the components of the respective embodiments can also be appropriately combined with each other to improve the efficiency of cleaning.

The invention claimed is:

1. A device for cleaning a monocrystalline pulling apparatus in which a semiconductor monocrystal is pulled from semiconductor melt stored in a crucible installed below a pull chamber by a wire suspended in the pull chamber of a sealed vessel, the device comprising:
    a main tube unit to be inserted into the pull chamber;
    an inner surface cleaning mechanism that is provided at an upper part of the main tube unit and cleans an inner surface of the pull chamber; and
    an axial position regulating mechanism that is provided at a lower part of the main tube unit and regulates an axial position of the main tube unit with respect to a direction of a central axis of the pull chamber in a state where the main tube unit is inserted into the pull chamber;
    wherein the inner surface cleaning mechanism includes a wiper member that is provided on an outer peripheral surface of the main tube unit and is in contact with the inner surface of the pull chamber in a state where the main tube unit is inserted into the pull chamber,
    the main tube unit includes:
    a retreat/housing section into which a seed chuck provided at a lower end of the wire retreats and which houses the seed chuck therein;
    a bottom that is provided at a lower part of the retreat/housing section; and
    a continuous extension mechanism that is connected to the bottom and to which a plurality of extension rods are added and joined in an axial direction,
    a partition wall is provided as the bottom of the retreat/housing section, and
    the axial position regulating mechanism includes a guide member that is provided on an outer peripheral surface of the main tube unit and is in contact with the inner surface of the pull chamber in a state wherein the main tube unit is inserted into the pull chamber, wherein the guide member is spaced apart from the wiper member, and wherein the guide member is not in direct contact with the wiper member.

2. The device for cleaning a monocrystalline pulling apparatus according to claim 1, wherein the wiper member is provided in an annular shape along an inner peripheral surface of the pull chamber.

3. The device for cleaning a monocrystalline pulling apparatus according to claim 2, wherein:
    the inner surface cleaning mechanism includes a wiper activating mechanism that deforms or moves the wiper member in a radial direction of the main tube unit, and
    the wiper activating mechanism includes a flexible bag body that is provided between the wiper member and the outer peripheral surface of the main tube unit, and the flexible bag body is configured to be inflated by injecting air into the flexible bag body.

4. The device for cleaning a monocrystalline pulling apparatus according to claim 3, wherein the flexible bag body is a rubber tube that is provided in an annular shape along the outer peripheral surface of the main tube unit.

5. The device for cleaning a monocrystal line pulling apparatus according to claim 1, wherein the guide member has a diameter substantially equal to or smaller than a diameter of the wiper member and is provided in a substantially annular shape along an inner peripheral surface of the pull chamber.

6. The device for cleaning a monocrystalline pulling apparatus according to claim 1, wherein the axial position regulating mechanism includes a second wiper member that is provided on an outer peripheral surface of the guide member and is in contact with the inner surface of the pull chamber in a state where the main tube unit is inserted into the pull chamber.

7. A method of cleaning a monocrystalline pulling apparatus by using the device according to claim 1, wherein in the monocrystalline pulling apparatus, a semiconductor monocrystal is pulled from semiconductor melt stored in a crucible installed below a pull chamber by a wire suspended in the pull chamber of a sealed vessel, the method comprising:

inserting the main tube unit of the device into the pull chamber,     adding and joining a plurality of extension rods, which are a continuous extension mechanism, to a lower part of the main tube unit,     regulating an axial position of the main tube unit with respect to a direction of a central axis of the pull chamber by the guide member of the axial position regulating mechanism provided at the lower part of the main tube unit; and     sliding the wiper member of the inner surface cleaning mechanism along an inner surface of the pull chamber while contacting the wiper member with the inner surface of the pull chamber and cleaning the inner surface of the pull chamber.

\* \* \* \* \*

UNITED STATES PATENT AND TRADEMARK OFFICE
CERTIFICATE OF CORRECTION

PATENT NO. : 11,305,319 B2
APPLICATION NO. : 16/482016
DATED : April 19, 2022
INVENTOR(S) : K. Okita It is certified that error appears in the above-identified patent and that said Letters Patent is hereby corrected as shown below:

On the Title Page

Item [30], change "Feb. 2, 2018" to -- Feb. 2, 2017 --

Item [30], change "PCT/JP2018/003666" to -- PCT/JP2017/003796 --

In the Claims

Column 18, Line 51 (Claim 5) change "a monocrystal line" to -- a monocrystalline --

Signed and Sealed this
Thirtieth Day of August, 2022

Katherine Kelly Vidal
*Director of the United States Patent and Trademark Office*